United States Patent
Hoffmann et al.

(10) Patent No.: US 9,798,248 B2
(45) Date of Patent: Oct. 24, 2017

(54) METHOD FOR PRODUCING A STRUCTURE

(71) Applicant: Nanoscribe GmbH, Eggenstein-Leopoldshafen (DE)

(72) Inventors: Joerg Hoffmann, Lustadt (DE); Philipp Simon, Karlsruhe (DE); Michael Thiel, Karlsruhe (DE); Martin Hermatschweiler, Karlsruhe (DE); Holger Fischer, Karlsruhe (DE)

(73) Assignee: Nanoscribe GmbH, Eggenstein-Leopoldshafen (DE)

( * ) Notice: Subject to any disclaimer, the term of this patent is extended or adjusted under 35 U.S.C. 154(b) by 189 days.

(21) Appl. No.: 14/801,427

(22) Filed: Jul. 16, 2015

(65) Prior Publication Data
US 2016/0041477 A1 Feb. 11, 2016

(30) Foreign Application Priority Data

Aug. 5, 2014 (DE) .................. 10 2014 215 439

(51) Int. Cl.
*G03F 7/20* (2006.01)
*G03F 7/32* (2006.01)

(52) U.S. Cl.
CPC ............ *G03F 7/70433* (2013.01); *G03F 7/20* (2013.01); *G03F 7/32* (2013.01); *G03F 7/70466* (2013.01)

(58) Field of Classification Search
CPC .......... G03F 7/20; G03F 7/32; G03F 7/70433; G03F 7/70466
USPC .............................. 430/22, 30, 296, 394, 942
See application file for complete search history.

(56) References Cited

U.S. PATENT DOCUMENTS

| | | | |
|---|---|---|---|
| 6,841,323 B2 * | 1/2005 | Nishi | G03F 7/70358 430/30 |
| 6,962,762 B2 * | 11/2005 | Martin | G03F 7/70433 430/22 |
| 7,687,210 B2 * | 3/2010 | Leidy | G03F 7/70466 430/22 |
| 2007/0241291 A1 | 10/2007 | Albrecht et al. | |
| 2008/0268350 A1 | 10/2008 | Yang | |
| 2012/0202138 A1 | 8/2012 | Lam | |

FOREIGN PATENT DOCUMENTS

| | | |
|---|---|---|
| CN | 101055428 A | 10/2007 |
| CN | 102156392 A | 8/2011 |
| DE | 10243413 | 12/2003 |
| DE | 102006036172 | 2/2008 |
| JP | 63237521 | 10/1988 |
| JP | 06204105 | 7/1994 |
| JP | 2009237334 | 10/2009 |

OTHER PUBLICATIONS

DE10243413 English Language Abstract (1 page).
DE102006036172 English Language Abstract (2 pages).

* cited by examiner

*Primary Examiner* — Christopher Young
(74) *Attorney, Agent, or Firm* — Ware, Fressola, Maguire & Barber LLP

(57) ABSTRACT

The invention relates to a method for producing a structure in a lithographic material, wherein the structure in the lithographic material is defined by means of a writing beam of an exposure device, in that a plurality of partial structures are written sequentially, wherein for writing the partial structures a write field of the exposure device is displaced and positioned sequentially and that a partial structure is written in the write field in each case, and wherein for positioning of the write field a reference structure is detected by means of an imaging measuring device. For calibration of the write field in the respectively positioned write field, before, during or after writing a partial structure, at least one reference structure element assigned to this partial structure is produced in the lithographic material with the writing beam, wherein the reference structure element after the displacement of the write field is detected by means of the imaging measuring device for writing a further partial structure.

16 Claims, 1 Drawing Sheet

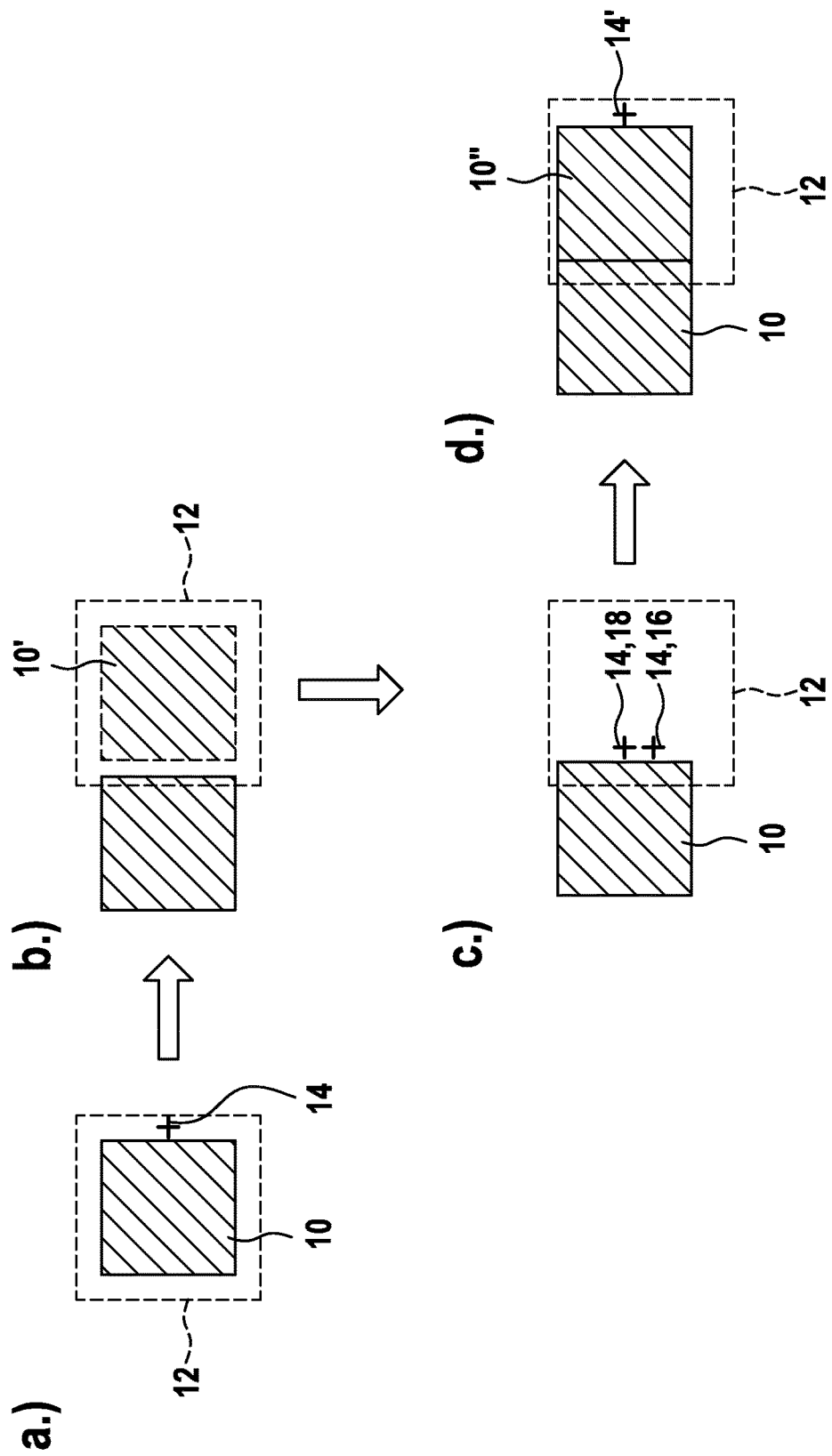

METHOD FOR PRODUCING A STRUCTURE

BACKGROUND OF THE INVENTION

1. Field of Invention

The invention relates to a method for producing a structure pursuant to the generic part of claim 1. Such methods are in particular developed as lithographic processes and are preferably used for the production of two-dimensional or three-dimensional microstructures or micro-optics, for example in semiconductor technology or in photonics.

In such processes, the write field specified by the exposure device is frequently smaller than the total structure to be obtained. To produce an expanded structure, the entire structure is therefore sliced into partial structures, which are written consecutively. For this purpose, the relative position of the write field is changed in steps on the substrate surface and a partial structure is respectively written in one position of the write field.

Therefore, the different partial structures must be positioned precisely and be placed against each other reciprocally aligned.

2. Description of Related Art

As, on the one hand, it is already known to arrange the substrate and/or the exposure device highly precisely in work tables that can be displaced in two dimensions. Such high precision tables can be monitored and controlled by means of interferometric measuring devices. Such type of devices are expensive in terms of engineering, however, and frequently require exact control and stabilization of the ambient operating conditions, which can make this procedure expensive.

It is moreover known to examine the positioning of the write field for writing the respective partial structures with the aid of reference structures and correct the positioning in the event of deviation, if necessary. For example, DE 10 2006 036 172 A1 within the meaning of the generic part of claim 1, describes to calibrate the displacement of the write field before the substrate by using an adjustment structure that is coupled with the work table. In this instance, the adjustment structure is provided separately from the substrate to be processed, i.e. it will not be generated on the substrate itself.

In the prior art is also known to carry out the actual method for producing a structuring with specially prepared substrates, on which an expanded reference structure is already defined. Such type of reference structure remains permanently on the substrate, however, and consists frequently of another material than the structuring to be obtained. In this respect, the reference structure can be an interference here. The rendering and form of the reference structure is furthermore invariant, so that no adaptation to the structure to be produced is possible. Because the reference structure is produced in a separate preparatory step, in addition the processing times are extended and the processes are more complicated overall. For the alignment and positioning of substrates, it is in principle also possible to utilize its already existing surface properties or surface structures, which are detected by means of microscopy, for example, or are known ("correlation stitching").

The object of the present invention is to ensure a precise positioning and adaptation of the different partial structures against each other during the mentioned production of expanded structures from partial structures in terms of technology as easily as possible, compared to the low requirements for controlling the ambient conditions in the prior art, and obtain consequently high flexibility during the rendering of the structures.

SUMMARY OF THE INVENTION

This problem is solved by a method pursuant to claim 1. Further embodiments result from the dependent claims and from the subsequent description.

The claimed method relates to the production of a structure in a lithographic material, e.g. in a lithographic material for coating a substrate surface (e.g. a wafer surface). The structure can extend into a plane essentially one-dimensionally or two-dimensionally. The structure can also be a three-dimensional object, however. The structure is written by means of at least one writing beam (e.g. laser beam or electron beam) of an exposure device into the lithographic material by local irradiation as a result of which a plurality of partial structures are written sequentially. For writing the partial structures, a write field of the exposure device in the lithographic material (e.g. relative to the substrate surface) is displaced and positioned sequentially in successive positioning steps. The displacement and positioning of the write field in principle can occur in all spatial directions, e.g. parallel or perpendicular to a substrate surface. In the respectively positioned write field, a partial structure is then written, and thereafter the write field is further displaced, if necessary. For positioning the write field for a respective partial structure, a reference structure is detected by means of an imaging measuring device.

According to the present invention it is provided that in each positioning step, i.e. if the write field is displaced and positioned, before, during or after the writing of the respective partial structure, at least one reference structure element (which contributes to the cited reference structure) that is assigned to this partial structure is generated in the lithographic material with the writing beam. The written reference structure element, following the displacement of the write field for writing a further partial structure, is detected by means of the imaging measuring device. The reference structure element is detected particularly within the write field. A detection outside of the write field is also conceivable, however.

The method according to the present invention can particularly also be configured as a lithographic method without a mask. In this process, no large-area mask is used, but the structure is written without a mask by precise beam control. Therefore it is possible to write adaptable structures flexibly without complex reconfiguration of the devices.

In order to generate expanded structures, the overall structure is sliced into partial structures using software technology, for example, which can be side-by-side two-dimensionally or also be stacked in layers, for example. The partial structures are written sequentially in the write field that is displaced in steps (in particular relative to the substrate surface). The assigned reference structure element is written in the same write field, i.e. before, during or after the writing of the respective partial structure. For the following partial structure, the write field is positioned or configured using this write field for a previously written reference structure element. While writing the following partial structure, an assigned reference structure element is written again, if necessary, and the process is continued correspondingly. In this respect, the entire reference structure for aligning the different partial structures is built up in situ in steps from the partial structures in each case. An advantage of the method also consists in that even partial structures that are stacked in layers and are generally three-dimensionally offset relative to one another can be reliably aligned relative to one another. This cannot be done easily, for example, when using substrates with predefined markers.

The written reference structure elements facilitate a reliable field-to-field alignment. When detecting the reference structure in the write field after it was displaced, the respective reference structure element appears in the coordinate system of the write field itself. This permits the partial structure to be created in the write field to be corrected, e.g. by coordinate transformation, scaling, displacement, transreferencing of the coordinate systems, or similar. This correction always occurs in the respective character spacing, i.e. in situ. For this reason, no precise reciprocal calibration of different components of the lithographic devices is required (e.g. an adjustment structure relative to a work table).

The write field is specified in principle by the technical circumstances of the exposure device and includes particularly that area on the substrate surface, in which the writing beam can be guided with the necessary precision.

A laser beam can be used as writing beam, e.g. such as in an exposure device that is developed as a laser lithograph.

In principle, the method according to the present invention is independent of the selected technology for structuring of the lithographic material. The use of an electron beam for example is conceivable, for example in an electron beam lithograph.

In the present context, such substances are designated as lithographic material, which change their material properties, in particular solubility in a developing medium, because of the irradiation with the writing beam. Examples are polymer-based lithographic varnishes, for example. The use of glass or glass-like lithographic materials is also conceivable, however, which are changing their properties because of the writing beam, as described. Photoresist materials are used in the optical lithography, for example. Depending upon the type of the changes introduced by the writing beam, photoresists can be differentiated into so-called negative photoresists (in which the solubility in a developing medium is reduced as a result of irradiation) or into so-called positive photoresists (in which the solubility in a developing medium is increased as a result of irradiation). Negative photoresists frequently include monomers, which are cross-linked into a polymer because of induced polymerization by means of the writing beam.

A further aspect of the present invention consists in that such lithographic material is used or the substrate surface is coated with such type of lithographic material, which because of local irradiation with the writing beam changes one of its optical properties, in particular its refractive index. It is then possible to identify the reference structure element because of the locally changed optical characteristic. For example, a reference structure element defined by a local change in the refractive index appears in an optical image as a detectable structure (e.g. incident light, transmitted light or scattered light).

For further rendering, after displacement of the write field, the position and/or the form of a previously defined reference structure element is detected and subsequently the positioning of the write field and/or the configuration of the partial structure to be written in the write field is corrected depending upon the detected position and/or form of the reference structure element. An advantage of the present invention therefore consists in that a complex technical arrangement (e.g. an interferometric measuring system) is not absolutely necessary for high precision positioning of the write field. Using the in situ detection of the reference structure element, the respective partial structure can be transformed or corrected accordingly, and positioning errors can thus be compensated.

It is conceivable that depending upon the detected position and/or form of the reference structure element, the displacement of the write field is changed and/or the partial sample will be adapted. In principle, known methods can be used for this correction. In particular, after the displacement of write field, a target position and/or a target configuration is determined (e.g. software technology) for the reference structure element and the target position and/or target configuration (e.g. contour, form) is compared with an actual position and/or an actual configuration of the detected reference structure element, and from that a position deviation and/or a configuration deviation is determined. Depending upon the position deviation and/or configuration deviation, preferably a correction of the positioning and/or a transformation of the partial structure to be written is preferably performed such, that the deviation is minimized. It is conceivable, for example, that the partial structure is transformed such (particularly with software technology), that the process structure is present in the desired configuration relative to the detected reference structure element. Potential transformations of the partial structure are scaling, coordinate transformation, compression, stretching, rotation, etc., for example.

For further rendering it is provided that the writing beam for generating the reference structure elements has a lower time average intensity than for writing the partial structures. Particularly the intensity for generating the reference structure elements is selected such that although a change of an optical characteristic of the lithographic material is caused by the irradiation, the chemical change of the lithographic material is not of a permanent nature, however, to the extent that a material structuring occurs in the later development steps. The intensity for a negative photoresist can be selected to be so small that no adequate cross-linking into polymeric structures occurs and that for that reason the reference structure elements are removed by the developing medium during subsequent development. The reference structure elements will therefore not be retained as interfering structures.

In principle, the partial structures can be written positioned directly adjacent to one another and aligned. But since the reference structure elements can be positioned to suit the needs, however, and can also be configured differently with different character spacing, the partial structures can also be produced to be spaced apart.

The method according to the present invention is inherently not restricted to produce contiguous patterns. It is conceivable, for example, that the different written partial structures are not contiguous but are configured spaced apart, wherein the reference structure elements are produced such that they are between different partial structures.

A reference structure element generated when writing a specific partial structure can also be configured and developed such that it is within a further partial structure, which will be written in a subsequent step, for example. It is also conceivable that the reference structure element is integrated in the partial structure. The produced reference structure elements are in particular overwritten with the consecutively written partial structures. It is also conceivable, however, that the produced structure is detached from the utilized substrate mechanically or chemically, but that the reference structure elements which are not integrated in the structure remain on the substrate.

After the writing of the structure, a development method for stabilizing the structure in the lithographic material can be carried out in principle. The method according to the present invention permits the reference structure elements to be configured such that they are removed during the development process. For this purpose, the reference structure elements can be written with lower intensity as explained, for example, so that the reference structure elements, other than the partial structures, are washed away from the developer. It is however also conceivable that the reference structure elements are not connected with the remaining structure and can therefore be rinsed off in a developer bath.

The displacement and positioning of the write field is carried out particularly with a positioning device. This can grip onto the substrate or onto the exposure device, as needed.

The positioning device can be developed such, for example, that the substrate can be shifted on an adjustable work table in a plane opposite the stationary exposure device. On the other hand, the exposure device can be shifted relative to the stationary substrate on an adjustable retention device. A combination of both possibilities of the relative movement is also conceivable. In principle, it is not necessary that the positioning device is of a high-precision design. For example, in practical applications therefore an error tolerance of >1 ˆm can be sufficient for microelectronics or photonics purposes. Without the procedure according to the present invention, such accuracy would result in significant imperfections when sequencing partial structures. Because of the in situ detection of the reference structure elements in the respectively shifted write field and the thereupon possible calibration of the next partial structure, the accuracy of the structuring on the area of the attainable and detectable linewidth can be improved for the reference structure, however. Error tolerances of <100 nm can thus be realized in practical applications.

An advantageous embodiment of the method consists in that prior to the writing of a partial structure and/or prior to the writing of a reference structure element, or after the displacement of the write field prior to the writing procedures, an image recording occurs by means of the imaging measuring device in the write field or even outside of the write field. Preferably, an image assessment process is then performed for detecting the reference structure element. In this context, the image recorded by the imaging measuring device can be transferred to an image assessment device. This can, for example, determine the position and form or configuration of the reference structure elements, e.g. using software technology in image assessment processes that are principally known from the prior art.

The imaging measuring device can be a scanning system, for example, which uses the writing beam of the exposure device itself as scanning beam. The writing beam scans the write field preferably with a low scanning intensity, which is preferably selected so low that neither a reference structure element is produced, nor a structuring in the lithographic material is defined. For imaging, the backscattered, reflected, transmitted or irradiation produced by fluorescence can then be detected by means of measuring optics. The measuring optics is preferably developed confocally to the device (e.g. a beam guidance optics) producing the writing beam. The scanning of the write field with the writing beam itself has the advantage that no additional imaging devices are required. The reference structure elements are moreover imaged directly in the reference system of the writing beam itself and thus make a direct calibration possible.

It is also conceivable however that a measuring camera is provided for detecting the reference structure, which measuring camera records the field of vision comprising the write field. This facilitates an in situ monitoring, in particular also during the write operation. The camera can in particular be permanently calibrated in relation to the write field of the exposure device. This calibration can already be done at the manufacturing location. Embodiments by means of a measuring camera can have the advantage that a faster image recognition is possible than by means of scanning systems. A combination of scanning systems and the measuring camera is also possible. In this instance, the measuring camera can for example record the entire write field and the writing beam can scan only one section, in which a reference structure element was detected, for example.

Since the reference structure are not written with a fixed mask but with the writing beam itself during the process, there is inherently no restriction in the rendering of the reference structure elements. The respective reference structure elements comprise preferably a rendering and configuration, which is adapted to the positioning of the write field for the subsequent structure. Different reference structure elements can be developed differently from one another for different partial structures, for example. This permits a design in line with demands. Depending upon the concrete rendering of the subsequent partial structure, a reference structure element can be arranged in such region, for example, which does not interfere with the subsequent partial structure.

An advantageous embodiment consists in that local irradiation is performed with the writing beam in a region of focus that is largely concentrated particularly in three dimensions, wherein this region of focus on the one hand is preferably in a plane of the write field, and on the other is displaceable in an upward direction perpendicular to the plane of the write field. This makes the production of three-dimensional structuring possible. For this purpose, particularly the principle of the non-linear lithography can be used, which generally utilizes a non-linear response of the lithographic material to the excitation with the writing beam. Particularly the procedure of the two-photon absorption of the multi-photon absorption for the exposure of the lithographic material can be utilized. In this instance, the wavelength of the writing beam is selected sufficiently large (and thus the photon energy is selected so low), that the chemical reaction (e.g. polymerization) required for the material structuring is caused by simultaneous absorption of two or multiple photons. The probability for such a process is significantly higher, because of fundamental considerations in the region of focus because of increased intensity. Overall it is possible to produce three-dimensional structures on the one hand, and on the other the reference structure elements can be positioned such that they are not linked with the material of the structure to be obtained. Such reference structure elements are then removed during the subsequent development process and do not remain in the structure.

In the following, the invention is further described, using the exemplary FIGURE enclosed.

BRIEF DESCRIPTION OF THE DRAWING

The FIGURE, including Sections a.) through d.), illustrates different situations schematically during a process for producing an expanded structure on the surface of a substrate.

DETAILED DESCRIPTION OF THE BEST MODE OF THE INVENTION

The FIGURE illustrates different situations schematically during a process for producing an expanded structure on the surface of a substrate, for example of a semiconductor wafer. For this purpose, the surface of the substrate is coated with a lithographic material (not illustrated), in particular with a lithographic varnish. The lithographic material can be applied onto the substrate in a spinning procedure. However, processes are also conceivable in which the lithographic material is not carried out by a spinning application, but that the lithographic material is present on the substrate surface as a viscous medium.

For producing the structure, it is sliced into a plurality of partial structures, as described at the outset, which are annotated with the reference symbol 10 in the FIGURE. The partial structures 10 are created in the lithographic material sequentially by means of a writing beam of an exposure device (e.g. laser lithography system) and are produced in the lithographic material and insofar are defined on the substrate surface. In this context, the writing beam of the exposure device can be controlled within a write field 12 with the necessary precision for purposes of structuring.

Section a) of the FIGURE illustrates an initial situation, selected as an example. The write field 12 is arranged at a desired position. A first partial structure 10 is defined in the lithographic material by the controlled guidance of the writing beam.

In order to create the desired overall structure, the subsequent partial structure must be produced in a precisely defined position, relative to the written partial structure. As an example, this would involve a total structure, in which the subsequent partial structure is to be defined directly adjacent to the already written partial structure (stitching).

In principle, for this purpose it is provided in a known manner that the write field 12 after writing of the first partial structure (Section a.) of the FIGURE) is displaced on the substrate surface, so that a subsequent partial structure 10' can be defined adjacently onto the already written partial structure 10. If the positioning device (not shown) used for the displacement of the write field 12 does not have the necessary precision, this could result in considerable positioning inaccuracy for the following character spacing. The following partial structure 10' does then not connect seamlessly onto the already written partial structure 10, as desired, but has an offset hereto, as shown in Section b.) of the FIGURE.

To solve this problem, a reference structure element 14 is defined in the lithographic material in situ, i.e. before, during or after the process step for writing the first partial structure (Section. a.) of the FIGURE). In this context, the reference structure element 14 can be defined spaced apart from the actual process structure 10, as indicated in Section a.) of the FIGURE.

As described at the outset, the reference structure element 14 is produced such that it can be detected by an imaging measuring device (not shown). The detection of the reference structure element 14 is utilized to position the write field 12 for writing the following partial structure and to calibrate the partial structure such that it connects onto the already existing partial structure 10, as desired.

For this purpose, initially the write field 12 is displaced by means of a positioning device, for example. For this purpose, the positioning device can have a mechanical design in a known manner, e.g. an adjustable two-dimensional substrate table. The present invention makes it possible to use positioning devices, which do not necessarily have to satisfy the requirements for high-precision positioning.

After the displacement of the write field 12, initially the reference structure element 14 defined in the preceding step (Section a.) of the FIGURE) according to the embodiment of the present invention illustrated in the FIGURE, is detected by means of the imaging measuring device. This detection preferably occurs in the displaced write field 12.

In the situation illustrated in Section c.) of the FIGURE, the position of the write field 12, due to the described positioning inaccuracy is such, that the actual position 16 of the reference structure element 14 in the coordinate system of the write field 12 deviates from the expected target position 18 of the reference structure element 14. It is also conceivable that a rotation or tilt of the write field 12 occurs (not shown).

The deviation between the target position and the actual position determined from the detected reference structure element 14 can now be used to transform the partial structure 10 to be produced in the write field 12 such that it connects directly onto the already written partial structure 10 as desired, in spite of any potentially existing positioning inaccuracy of the write field 12. This is outlined in the Section d.) of the FIGURE.

To facilitate a reliable detection and calibration of the partial structure 10 to be written in dependence of the detected reference structure element 14, this will preferably have a design which deviates from an axisymmetric form. Cross-shaped forms can be used, as indicated in the FIGURE. However, arrow-like structures or complex polygonal structures are also conceivable.

THE SCOPE OF THE INVENTION

It should be understood that, unless stated otherwise herein, any of the features, characteristics, alternatives or modifications described regarding a particular embodiment herein may also be applied, used, or incorporated with any other embodiment described herein. Also, the drawings herein are not drawn to scale.

Although the invention has been described and illustrated with respect to exemplary embodiments thereof, the foregoing and various other additions and omissions may be made therein and thereto without departing from the spirit and scope of the present invention.

The invention claimed is:

1. A method for producing a structure in a lithographic material, wherein the structure in the lithographic material is defined by means of a writing beam of an exposure device in that a plurality of partial structures (10) are written sequentially, wherein for writing the partial structures (10) a write field (12) of the exposure device is sequentially displaced and positioned and in each case a partial structure (10) is written in the write field (12) by local irradiation in a region of focus of the writing beam, which region of focus is displaced in a plane of the write field (12), and wherein for positioning the write field (12) a reference structure is detected in the lithographic material by means of an imaging measuring device, characterized in that in the respectively positioned write field (12), before, during or after the writing of a partial structure (10) at least one reference element (14) assigned to this partial structure (10) is produced with the writing beam in the lithographic material, wherein after displacement of the write field (12) for the writing of a further partial structure (10), the at least one reference structure element (14) is detected by means of the imaging measuring device;

wherein the method further comprises detecting, after displacement of the write field (12), the position and/or the form of a previously defined reference structure element (14), and correcting the positioning of the write field (12) and/or the partial structure (10) to be written in the write field (12) as a function of the detected position and/or form of the reference structure element (14).

2. The method according to claim 1, characterized in that the method comprises using a lithographic material which changes an optical characteristic by local irradiation with the writing beam, in particular its refractive index, by local irradiation with the writing beam, wherein the reference structure element (14) is detected by means of the locally changed optical characteristic of the lithographic material.

3. The method according to claim 1, characterized in that the writing beam for producing the reference structure elements (14) has a lower intensity than for writing the partial structures (10).

4. The method according to claim 1, characterized in that the method comprises overwriting the reference structure element (14) when writing a further partial structure (10).

5. The method according to claim 1, characterized in that the method comprises configuring the different written partial structures (10) not adjacently to one another, wherein the reference structure elements (14) are produced such that they are arranged between the different partial structures (10).

6. The method according to claim 1, characterized in that the method comprises carrying out, after writing the partial structures (10), a development process, wherein the reference structure elements (14) are removed during the development process.

7. The method according to claim 1, characterized in that the displacement and positioning of the write field (12) by means of a positioning device takes place as a result in that a substrate supporting a lithographic material is displaced relative to the stationary exposure device, and/or that the exposure device is displaced relative to the stationary substrate.

8. The method according to claim 1, characterized in that an image recording occurs by means of the imaging measuring device and that for detecting the reference structure element (14) an image assessment process is carried out.

9. The method according to claim 1, characterized in that for the detection of the reference structure element (14) the write field (12) is scanned with the writing beam and for imaging, the backscattered, reflected, transmitted or radiation produced by fluorescence is detected by means of a measuring optics.

10. The method according to claim 1, characterized in that for detection of the reference structure elements (14), a field of vision comprising the write field (12) is taken with a measuring camera.

11. The method according to claim 1, characterized in that the position of the reference structure element (14) in the write field (12) and/or the form of the reference structure element (14) is selected differently for different partial structures (10).

12. The method according to claim 1, characterized in that the local irradiation of the writing beam occurs in a region of focus, which can be displaced along an upward direction perpendicular to the plane of the write field (12).

13. The method according to claim 2, characterized in that the writing beam for producing the reference structure elements (14) has a lower intensity than for writing the partial structures (10).

14. The method according to claim 2, characterized in that the method comprises carrying out, after writing the partial structures (10), a development process, wherein the reference structure elements (14) are removed during the development process.

15. The method according to claim 8, characterized in that for the detection of the reference structure element (14) the write field (12) is scanned with the writing beam and for imaging, the backscattered, reflected, transmitted or radiation produced by fluorescence is detected by means of a measuring optics.

16. The method according to claim 8, characterized in that for detection of the reference structure elements (14), a field of vision comprising the write field (12) is taken with a measuring camera.

* * * * *